United States Patent [19]

Woodman

[11] Patent Number: 4,868,712
[45] Date of Patent: Sep. 19, 1989

[54] THREE DIMENSIONAL INTEGRATED CIRCUIT PACKAGE

[76] Inventor: John K. Woodman, 601 Mystic La., Foster City, Calif. 94404

[21] Appl. No.: 113,635

[22] Filed: Oct. 27, 1987

Related U.S. Application Data

[63] Continuation-in-part of Ser. No. 10,820, Feb. 4, 1987, abandoned.

[51] Int. Cl.[4] .................................................. H05K 7/20
[52] U.S. Cl. .................................. 361/388; 361/396; 361/414
[58] Field of Search ............... 357/74, 80, 81, 82; 361/382–389, 414, 395, 400, 401, 403, 408, 410, 412, 413, 396; 439/55, 59, 61, 65, 68, 69, 70, 71, 74; 165/80.2, 80.3, 104.33

[56] References Cited

U.S. PATENT DOCUMENTS

| | | | |
|---|---|---|---|
| 3,202,869 | 8/1965 | Matson et al. | 361/388 X |
| 3,320,351 | 5/1967 | Glickman | 361/393 X |
| 3,676,748 | 7/1972 | Kobayashi et al. | 361/393 X |
| 3,689,336 | 9/1972 | Bunker et al. | 156/89 |
| 4,093,021 | 6/1978 | Groom | 165/1 |
| 4,137,559 | 1/1979 | Reuting | 361/393 X |
| 4,167,647 | 9/1979 | Salera | 357/74 X |
| 4,288,841 | 9/1981 | Gogal | 361/414 |
| 4,304,626 | 12/1981 | Carson et al. | 156/630 |
| 4,330,812 | 5/1982 | Token | 361/387 |
| 4,338,652 | 7/1982 | Romanczuk et al. | 361/388 |
| 4,348,687 | 9/1982 | Keller et al. | 357/79 |
| 4,403,102 | 9/1983 | Jordan | 361/388 |
| 4,450,472 | 5/1984 | Tuckerman et al. | 357/82 |
| 4,492,975 | 1/1985 | Yamada et al. | 357/76 |
| 4,493,010 | 1/1985 | Morrison | 361/415 |
| 4,502,098 | 2/1985 | Brown | 361/415 |
| 4,525,921 | 7/1985 | Carson et al. | 29/577 |
| 4,535,385 | 8/1985 | August | 361/414 |
| 4,547,795 | 10/1985 | Wulff | 357/80 |
| 4,551,629 | 11/1985 | Carson et al. | 250/578 |
| 4,567,505 | 1/1986 | Pease et al. | 357/81 |
| 4,573,067 | 2/1986 | Tuckerman et al. | 357/82 |
| 4,578,697 | 5/1986 | Takemae | 357/75 |
| 4,614,194 | 9/1986 | Jones et al. | 357/80 X |
| 4,727,410 | 2/1988 | Higgins, III | 361/412 |

FOREIGN PATENT DOCUMENTS

| | | | |
|---|---|---|---|
| 653778 | 12/1962 | Canada | 361/393 |
| 676348 | 12/1963 | Canada | |
| 870291 | 5/1971 | Canada | 356/14 |

Primary Examiner—Gerald P. Tolin
Attorney, Agent, or Firm—Flehr, Hohbach, Test, Albritton & Herbert

[57] ABSTRACT

This invention discloses a three-dimensional, high density package for integrated circuits for which integrated circuits are placed onto substrate layers and then stacked together. Techniques for interconnecting the layers to one another and for connecting the layers to external circuitry are also disclosed. Techniques for cooling the stack with heat sinks or fluid flow are also disclosed.

17 Claims, 9 Drawing Sheets

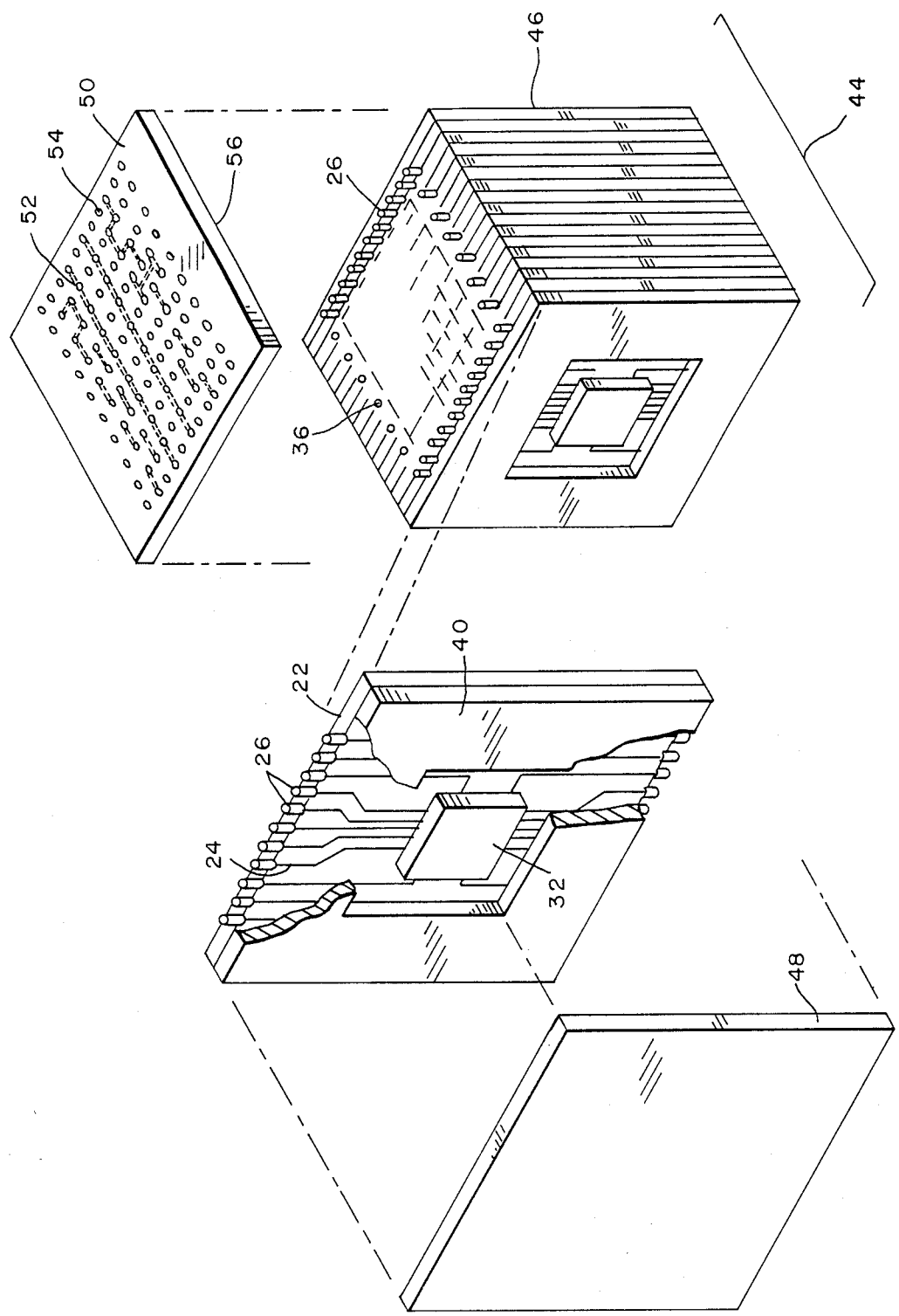
FIG.—3

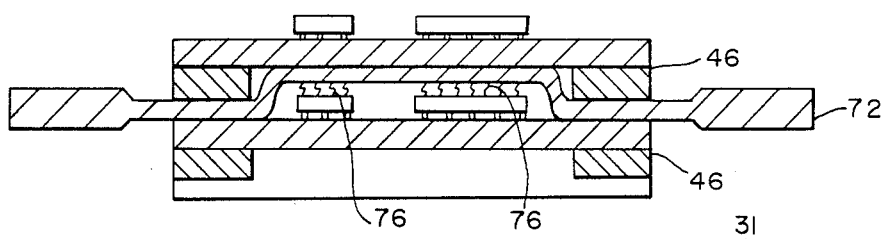
FIG.—4A
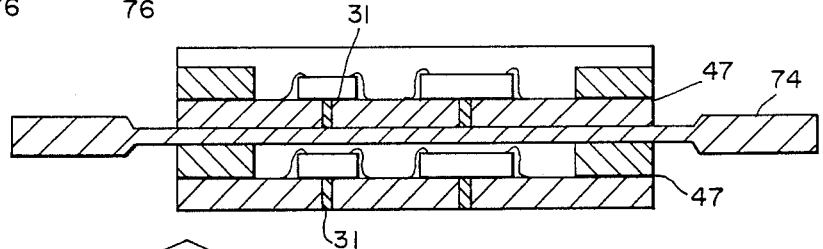
FIG.—4B
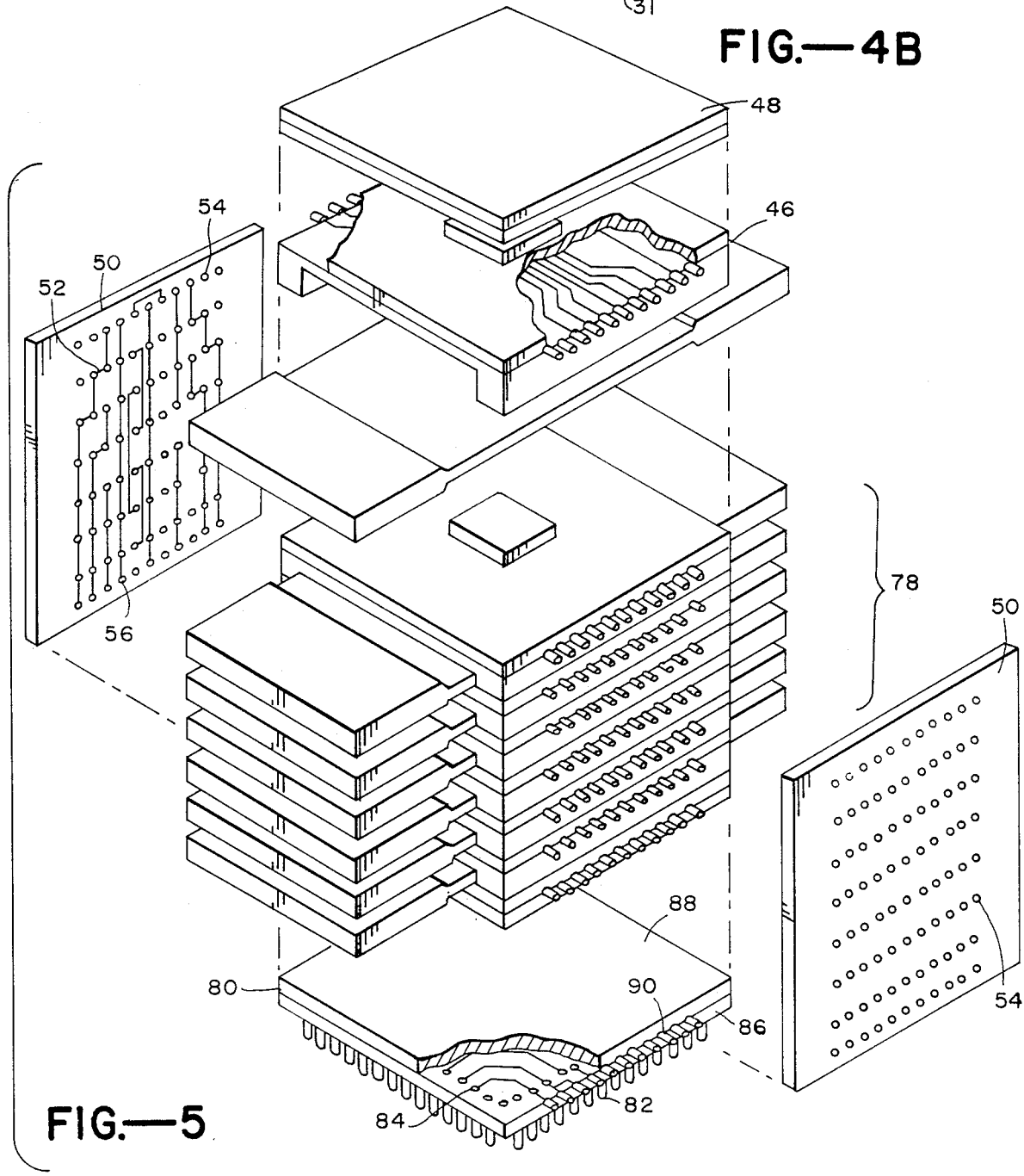
FIG.—5

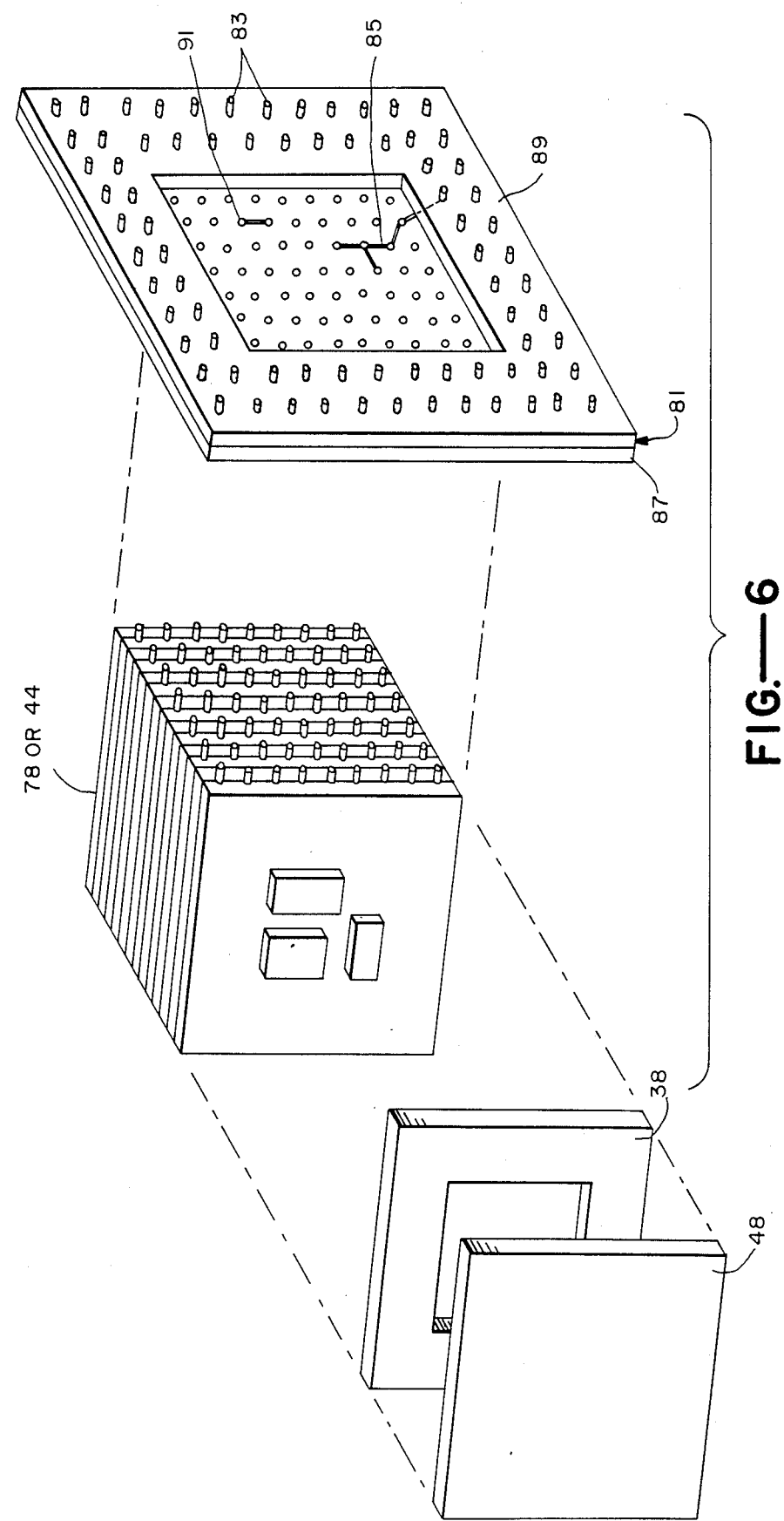

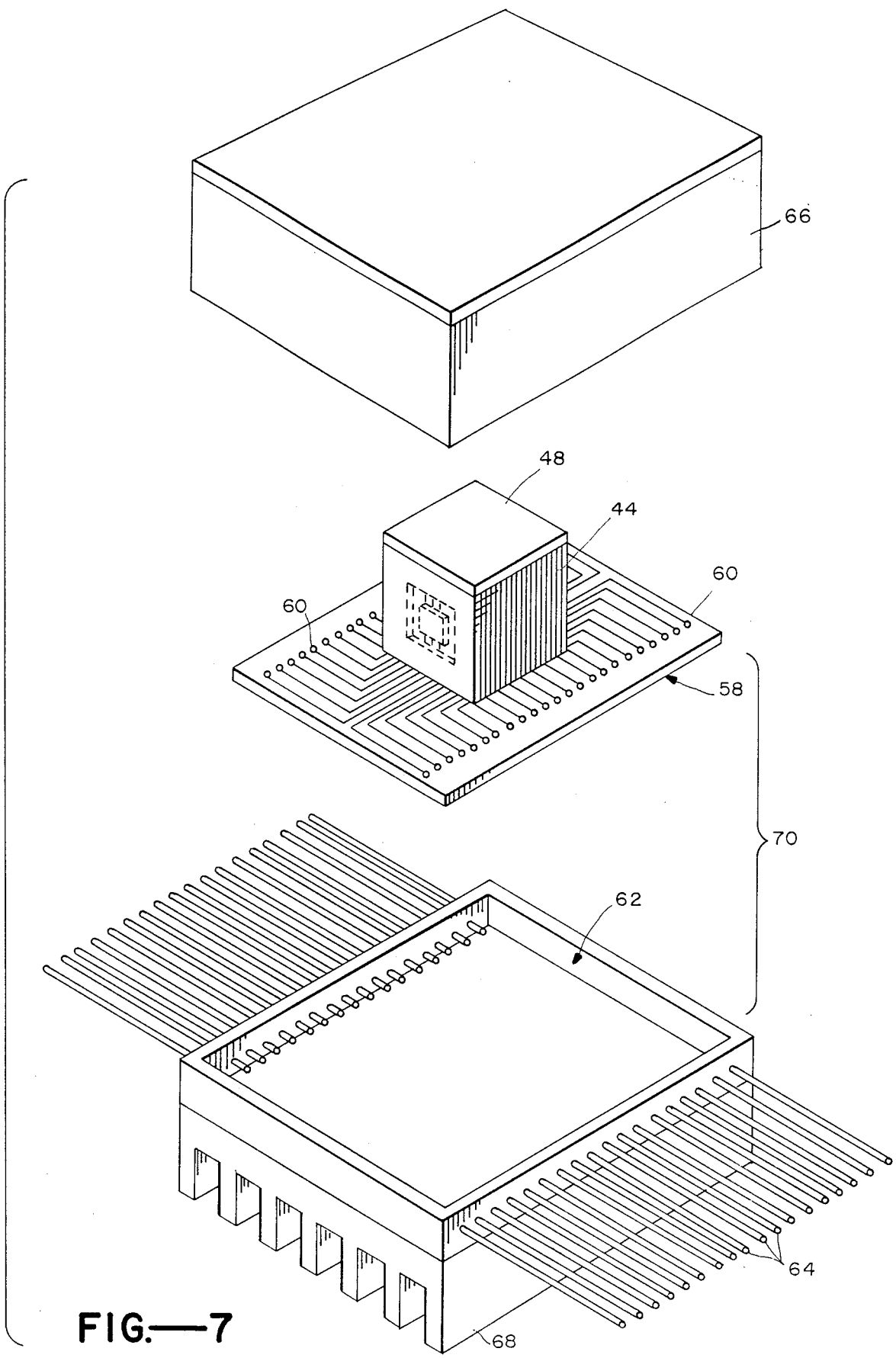
FIG.—7

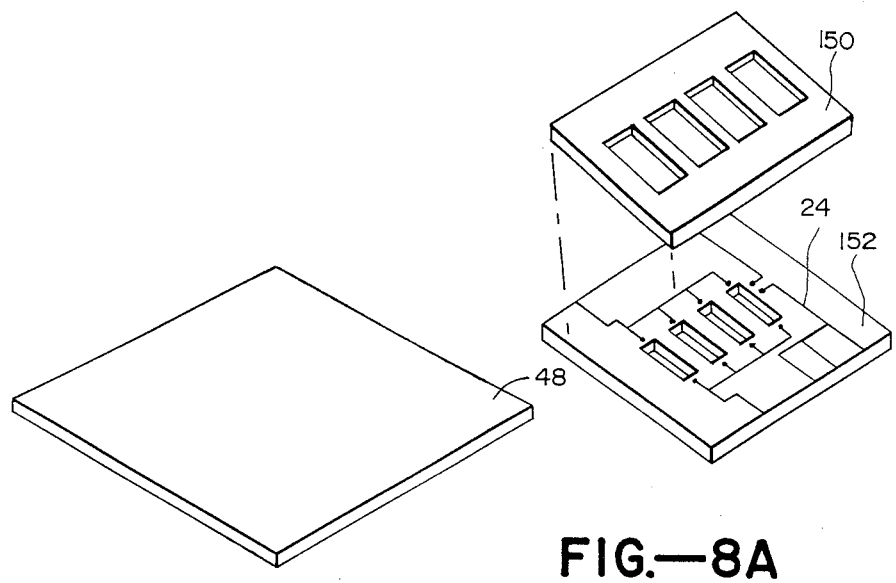
FIG.—8A
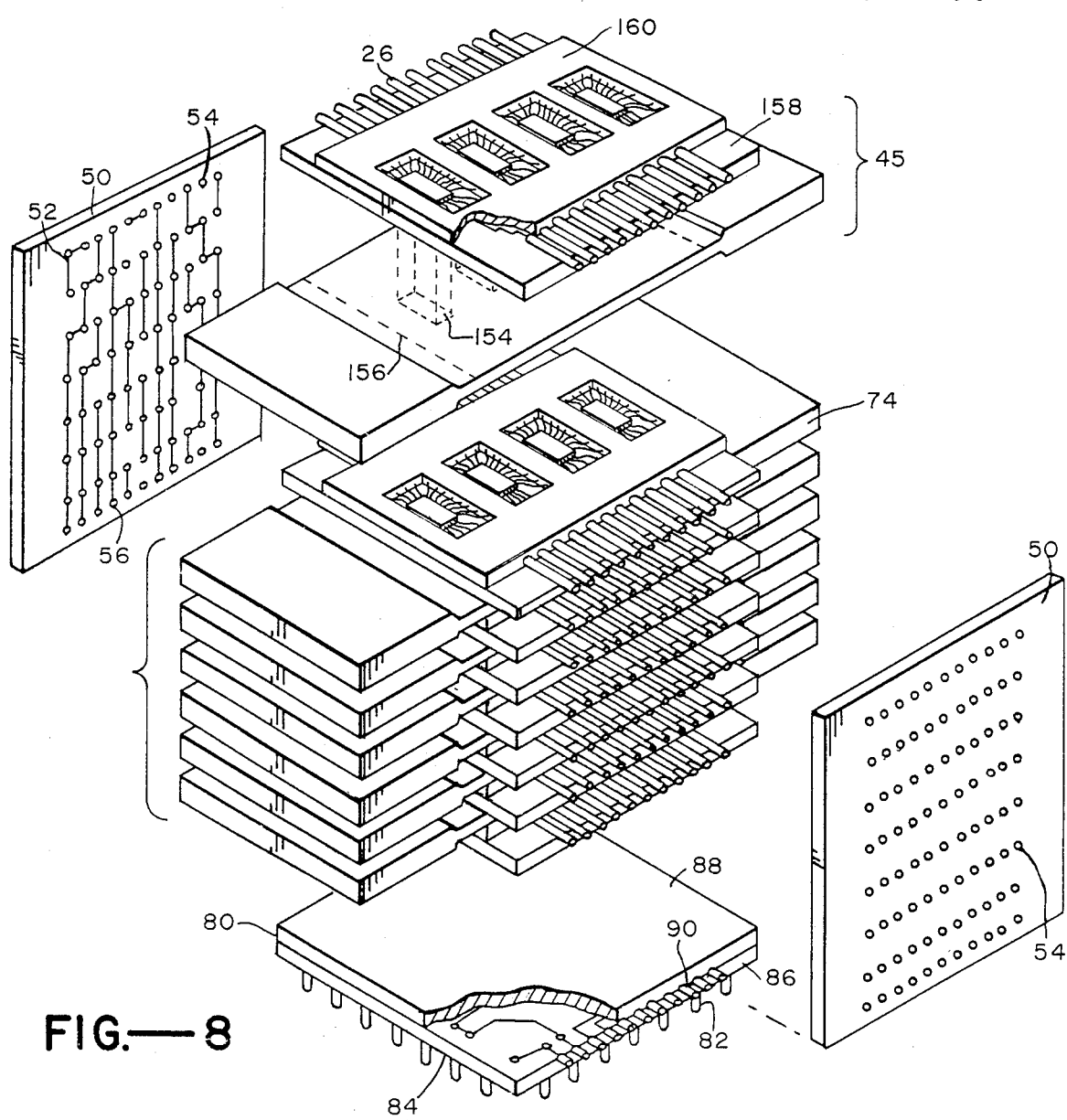
FIG.—8

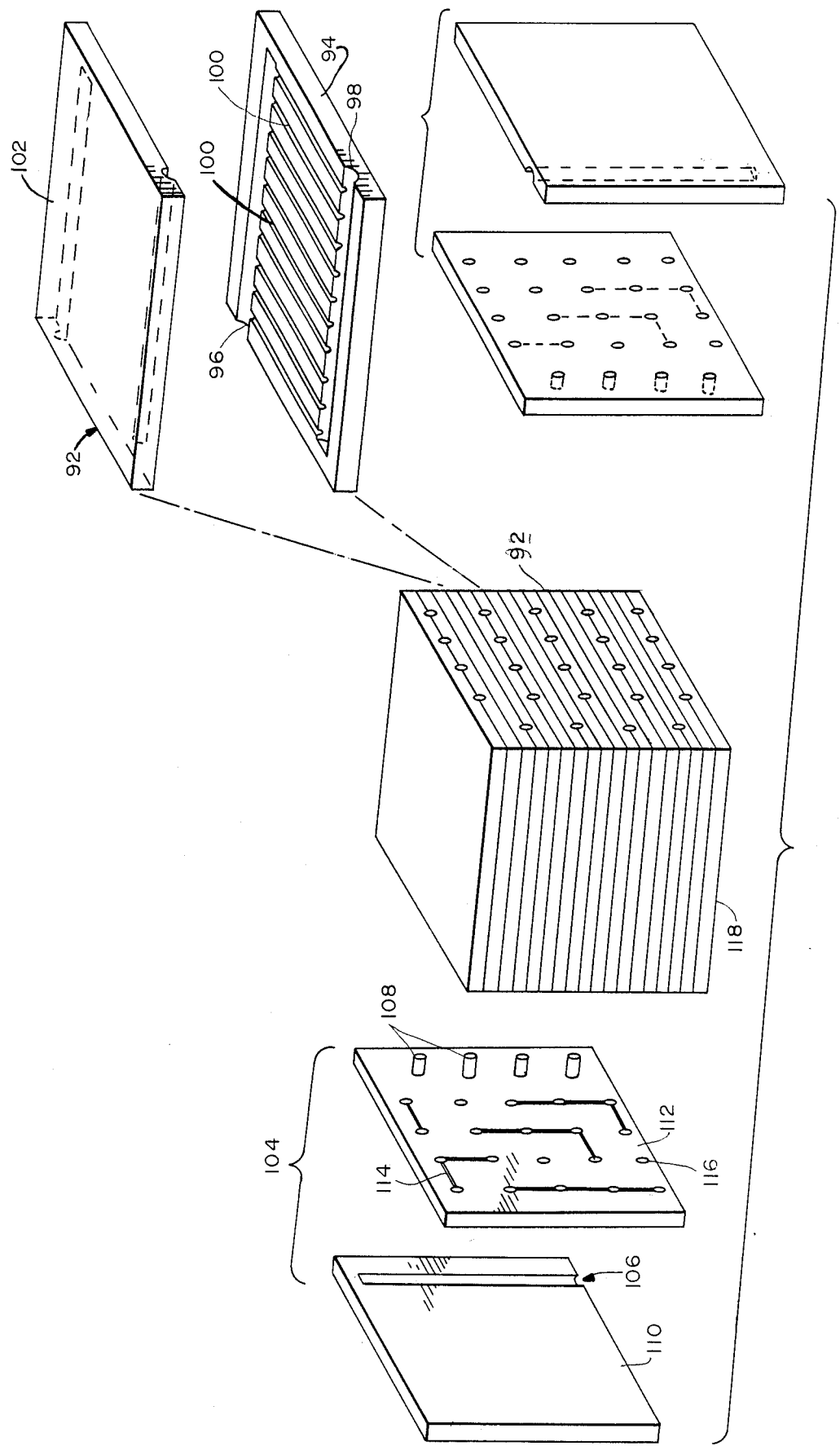
FIG.—9

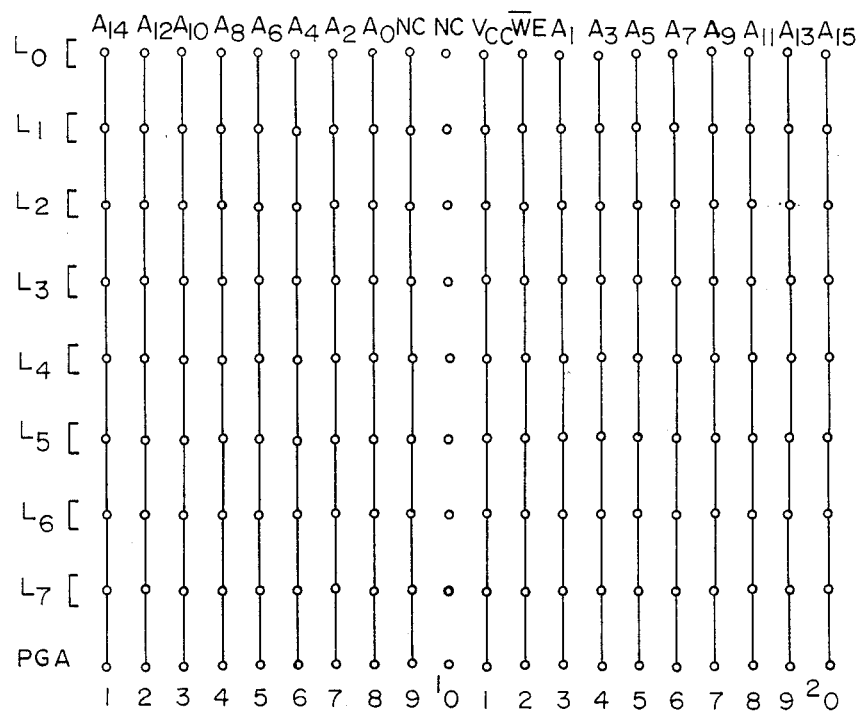
FIG.—10
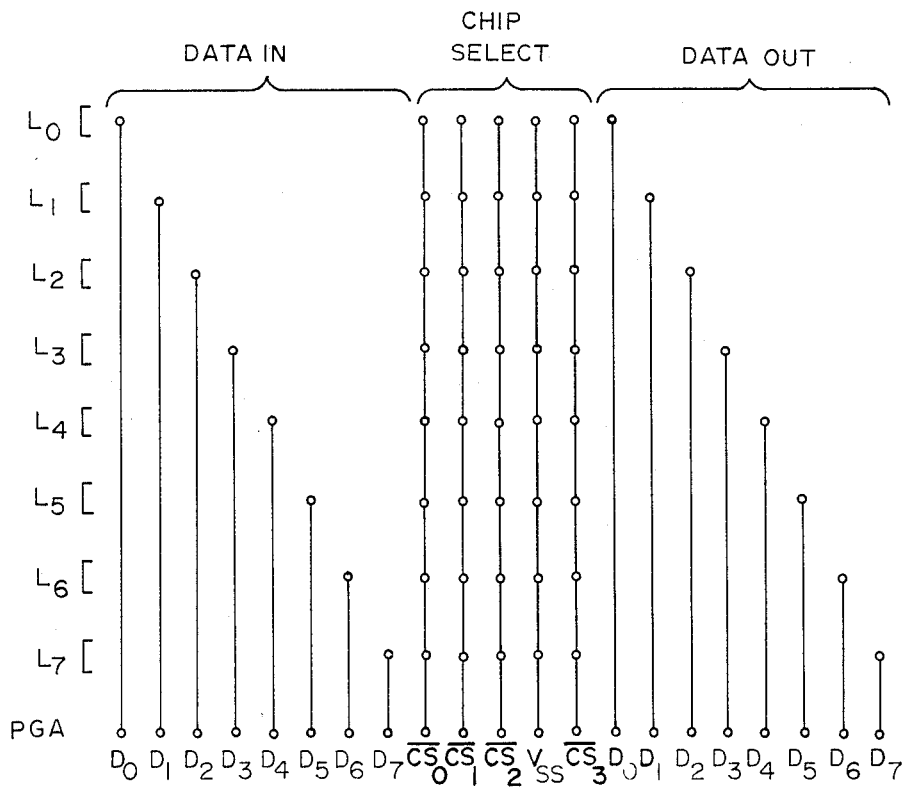
FIG.—11

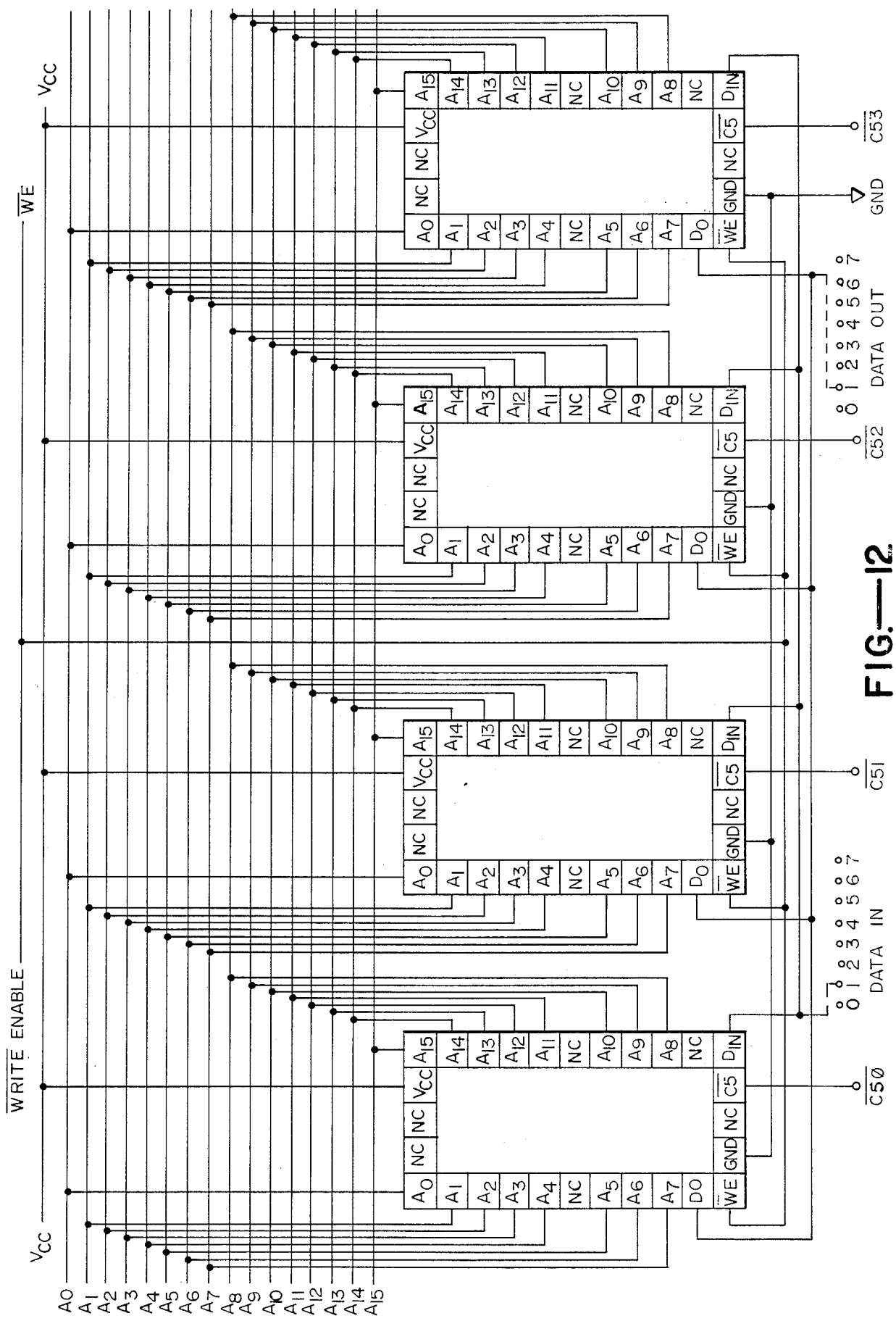
FIG.—12

THREE DIMENSIONAL INTEGRATED CIRCUIT PACKAGE

PRIORITY CLAIMED

This patent is a continuation-in-part of my application Ser. No. 010,820 now abandoned filed on Feb. 4, 1987 and claims priority thereunder.

FIELD OF THE INVENTION

This invention relates to the improved packaging of multiple electronic circuit devices. More particularly this invention describes a three dimensional structure, which when implemented as described offers the capability for packaging, interconnecting and cooling a large number of integrated circuits in an extremely dense and easily manufactured unit.

BACKGROUND OF THE INVENTION

In the field of electronics it has been a continual goal of engineers to reduce the size of systems. The majority of system size reduction has been achieved through utilization of integrated circuit technology. A primary aim of these technologies has been to reduce transistor size and integrate increasingly dense circuitry and functionality within a single integrated circuit.

In order to connect integrated circuits to operational electronic systems, some means must be available for transferring signals and power into and out of the integrated circuit. Typically, each chip is placed into its own chip package. Wires are then connected between bond pads on the chip and pins on the package. Several such packages (DIPs, SIPs, LCC, PGA, etc.) are then assembled onto various media (ceramic, epoxy, metallized layers, etc.) to perform useful functions. For purposes of this description define "chip" to means a completed integrated circuit die prior to the formation of any physical or electrical connection thereto. The "major surface" of the chip is defined to be that surface on which the integrated electronics have been disposed. The "back surface" of the chip shall be that surface opposite the major surface.

Packaging technology has essentially allowed for the placement of a chip into a protective environment which allows for the interconnection of the chip to external circuitry. The integrated circuit is then electrically connected (bonded) to external connectors. Historically integrated circuit packages have been cylindrical cans with wire pins housing small chips. Subsequently Dual-In-Line packages (DIPs) made of plastic or ceramic with two parallel rows of pins became the industry standard. Due to increased lead count (pin) requirements Pin Grid Array (PGA) packages, which have a matrix of pins extending from the bottom of the package, and Leadless Chip Carrier (LCC) packages, which have an array of external connector lands around the package edge, have been developed.

Typical integrated circuit packages contain only one integrated circuit. The package "footprint" is many times the area of the integrated circuit. To satisfy the requirements for increasing the density of electronic circuitry within a system, attempts have been made to employ three-dimensional stacking of integrated circuits. Such three-dimensional techniques attempt to overcome the difficulties which face the designer of hybrid circuits. A hybrid circuit typically consists of a two dimensional structure made up of a large insulated substrate, usually ceramic, onto which are connected in lateral orientation, two or more chips, packaged chips and/or other electronic components. These techniques are well known in the art, but their effectiveness at significantly increasing circuit density is somewhat limited.

A technique proposed in Carson, et al., U.S. Pat. No. 4,551,629 involves the three dimensional stacking of chips. While this stack of chips has a higher packaging density than any of the previously described techniques there are severe manufacturing, thermal and testing difficulties which make this technique difficult and expensive to implement. These difficulties relate to the complexity of the stacking process together with the processing problems associated with attempting to form external connections to the semiconductor stack. The package cannot easily be made hermetic. Special chips must be designed and configured for use with this technique. Further, complex wafer processing techniques must be applied to the edges of the stack prior to external connection. Because of this additional processing the circuits cannot be tested at each step of the processing causing extensive manufacturing yield loss. A severe limitation is imposed by the requirement that all of the stacked devices must have the equal dimensions.

It is an object of this invention to provide a high density packaging technology for chips.

It is another object of this invention to use this packaging technology to provide a variety of high-density packages for chips useful for a variety of applications.

It is another object of this invention to have the manufacturing steps for forming high density packages use industry standard packaging techniques.

Still another object of this invention is to provide high density integrated circuit packages which are suitable for use with standard commercial chips of various dimensions.

Yet another object of this invention is to provide efficient and convenient means for cooling such high density chip packages.

A further object of this invention is to provide an efficient means for the interconnection of the chips in such a high density package.

An additional object of this invention is to provide a structure which is easy to test both during and subsequent to manufacturing.

SUMMARY OF THE INVENTION

This invention is for an improved package and packaging technology for chips from which circuit modules are formed which are significantly denser and easier to manufacture than previously existing techniques allowed. The techniques of this invention are applicable for use with any form of commercially available chip. Standard commercially available chips may be used without any modification or special manufacturing steps.

In accordance with the present invention, at least one chip is mounted on each of a plurality of substrates, commonly ceramic, each of which has electronically conducting traces for carrying electronic signals. The chips connect electrically to the traces by means such as wire bonds, flip chip bonding, or TAB bonding. At least certain of the traces extend to edges of the substrate for the purpose of making electrical connections from the chip(s) on the substrate to external circuitry. Other traces may extend from one edge of the substrate to another edge to allow the pass-through of an external signal. Other traces may extend between multiple chips on these single substrates which contains more than one chip. Pins which extend from the edge of the substrate are connected to the pattern of traces on each layer. A substrate may contain multiple layers of traces for the distribution of signals, power or ground voltages and currents.

Two or more substrates are connected together, one on top of the other, to form a dense stack of electronic circuitry. Between each layer, a window frame spacer, commonly ceramic, surrounds and protects the chips. Define "layer" to consist of a substrate, traces, chips, and external connections.

Side interconnection plates (SIP) electrically connect between layers. A SIP is a substrate, commonly ceramic, on which appropriately placed conducting traces are formed. The SIP is coupled to receive signals from and supply signals to the external connectors of each layer (pins). At least one trace on a SIP may be so configured as to connect to each layer within the stack such as for a bus signal, ground or power supply. Through the use of layer pass-throughs and SIPs, signals may be routed anywhere around or within the stack. SIPs may have multiple layers of traces.

Three basic configurations are described for making external connection from the stack. A first device uses an external side interconnection plate (ESIP). An ESIP is similar to a SIP except that the ESIP is larger than the side of the stack to which it connects and certain traces on the ESIP extend beyond the edges of the stack and terminate in lands (bond pads) of sufficient size to receive a wire bond.

A module subassembly consists of a stack, SIP(s) and ESIP and is mounted within a package base. Package pins for external connection to the completed device penetrate and terminate within the package base. Using standard integrated circuit wire bonding techniques, the ESIP bond pads are bonded to the package pins. A cap covers the stack, SIP and ESIP assembly to protect the stack from mechanical damage and to provide an hermetic seal.

A second configuration used for making external connections from the stack connects the stack to a base plate out of which extends an array of pins, similar to a standard pin grid array (PGA) single chip package. Conductive traces are formed on a substrate, usually ceramic, forming the base. The base may contain multiple layers of traces as required by the specific application being implemented. Pins penetrate the layer and are electrically coupled to the traces. The traces extend to those edges which correspond to the edges of the stack to be coupled to SIPs. SIPs connect to the base as if the base was simply another layer in the stack.

A third configuration connects the stack to a second PGA-like base. In this configuration the connectors on the edges of each layer connect to the PGA base plate as if it were a SIP. Vias and traces connect the connectors on the edges of each layer to the pins on the bottom of the PGA package. If the connectors on the edges of the layers are pins then the PGA package pins will only reside around the periphery of the base plate. Using such pin connections allows the added advantage of inspectibility of the connections from the stack to the base plate. Further, with this configuration the base plate may be larger than the surface of the stack to which it attaches allowing for additional pins.

Due to the high circuit density, certain applications may require that means be provided for cooling the stack. A first such means for the ESIP-type module includes attaching a heat sink to the outside of the package base. A second means includes interspersing heat sink members at predetermined intervals within the stack. A third means includes interspersing liquid cooling layers at predetermined intervals within the stack. These and other features and advantages of the present invention will become more apparent upon a perusal of the following detailed description taken in conjunction with the accompanying drawings wherein similar characters of reference refer to similar items in each of the several views.

BRIEF DESCRIPTION OF THE DRAWINGS

FIG. 3 shows a stack and SIP.

FIG. 4 shows in cross-section two relationships of heat sink fins to layers.

FIG. 5 shows an exploded view of a second embodiment of a completed module on PGA base with heat sink fins.

FIG. 6 shows an alterative method for connecting a stack to PGA base.

FIG. 7 shows an alternate embodiment of a completed module on ESIP base.

FIG. 8 shows an exploded view of an alternate embodiment of the present invention.

FIG. 9 shows an exploded view of a third embodiment of a completed module on PGA base with liquid cooling layers.

FIG. 10 and FIG. 11 show the SIP traces necessary for a ¼ MByte application.

FIG. 12 shows the traces necessary for a single layer of the ¼ MByte application.

DETAILED DESCRIPTION OF THE PREFERRED EMBODIMENT

Many of the techniques disclosed in this detailed description of the invention are exemplary only and it should be clear to one skilled in the art that alternate techniques may be employed in practicing this invention. Further, other techniques which are peripheral to the invention and well known in the art, such as how to attach an integrated circuit to a ceramic substrate, are not disclosed so as to prevent obscuring the invention in unnecessary detail.

Figures 1A, 1B, 1C, 1D:
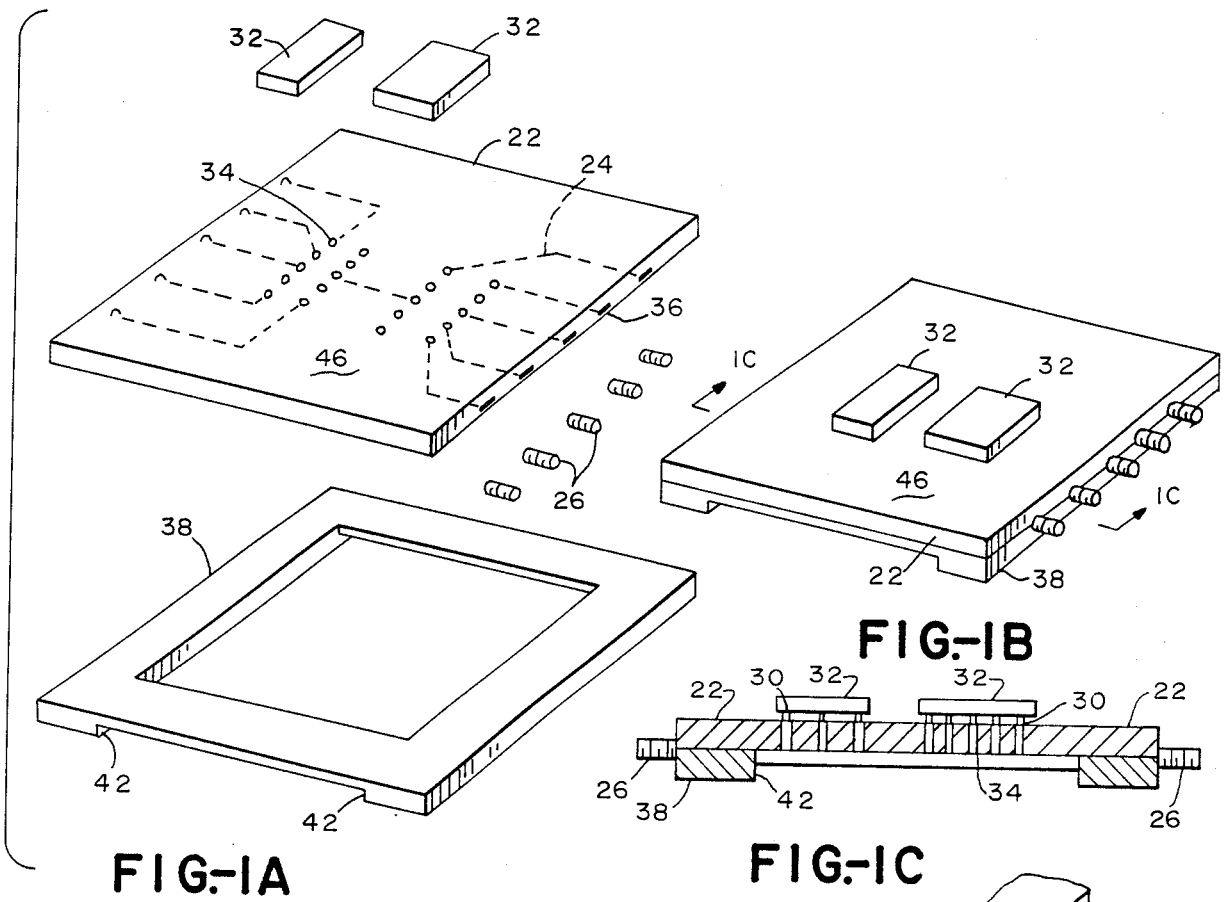
FIGS. 1a, 1b and 1c show an exploded perspective view, an elevational perspective and a cross-sectional view respectively of the preferred embodiment of the present invention.

As shown in FIG. 1, metal traces 24 are disposed on a rectangular substrate 22 through normal photo lithographic, thin film and/or thick film techniques. The substrate may be formed of any material suitable for electronic packaging including but not limited to ceramic (Aluminum Oxide), polyimide, epoxy-glass, Beryllium Oxide, Aluminum Nitride, or Silicon. FIG. 1a shows traces 24 as dotted lines indicating that they are either on the under side of substrate 22 or internal or both. These traces are defined in such a manner as to have proper orientation in order to be electrically coupled to receive signals from preselected chips 32. Certain traces 24 terminate along the edge of substrate 22. Connector pins 26 are connected (usually brazed) onto the edge of substrate 22 and are coupled to receive electronic signals from traces 24. In the alternative, traces 24 may end in depressions 36 for solder reflow bonding. Other traces 24 may extend from one edge of substrate 22 to another edge to simply pass-through a signal which is external to the substrate 22. For those substrates 22 with more than one chip 32 still other traces 24 may couple those chips 32 to one another. Yet other traces 24 may form integral capacitors on substrate 22 to decouple noise from chips 32.

Chips 32 are connected to substrate 22 and are electrically coupled to traces 24 through standard bonding techniques such as by flip chip bonds 28 or wire bonds 30. Where traces 24 and chips 32 are on opposite faces of substrate 22 as shown in FIG. 1, electrical coupling between chips 32 and traces 24 must occur through vias 34. For certain applications which require increased density chips 32 may be mounted on either face of substrate 22 with coupling between such chips 32 occurring through vias 34. Depending upon the number of pins 26 necessary for electrical interconnection as required by the particular application those external connections may be positioned along any or all edges of substrate 22. Two or more substrates 22 are joined together to form a stack. Spacer 38 or 40, a frame structure, is placed between successive substrates 22 to protect chip(s) 32. Spacer 38 will be thicker for those applications having chips 32 on either face of substrate 22 than for those applications having chips 32 on only one face of substrate 22. The notch 42 in spacer 38 is used to mechanically hold a heat sink in place as described below. Spacer 38 or 40 may be formed separately or be fabricated integrally with each substrate 22.

Figures 2A, 2B, 2C:
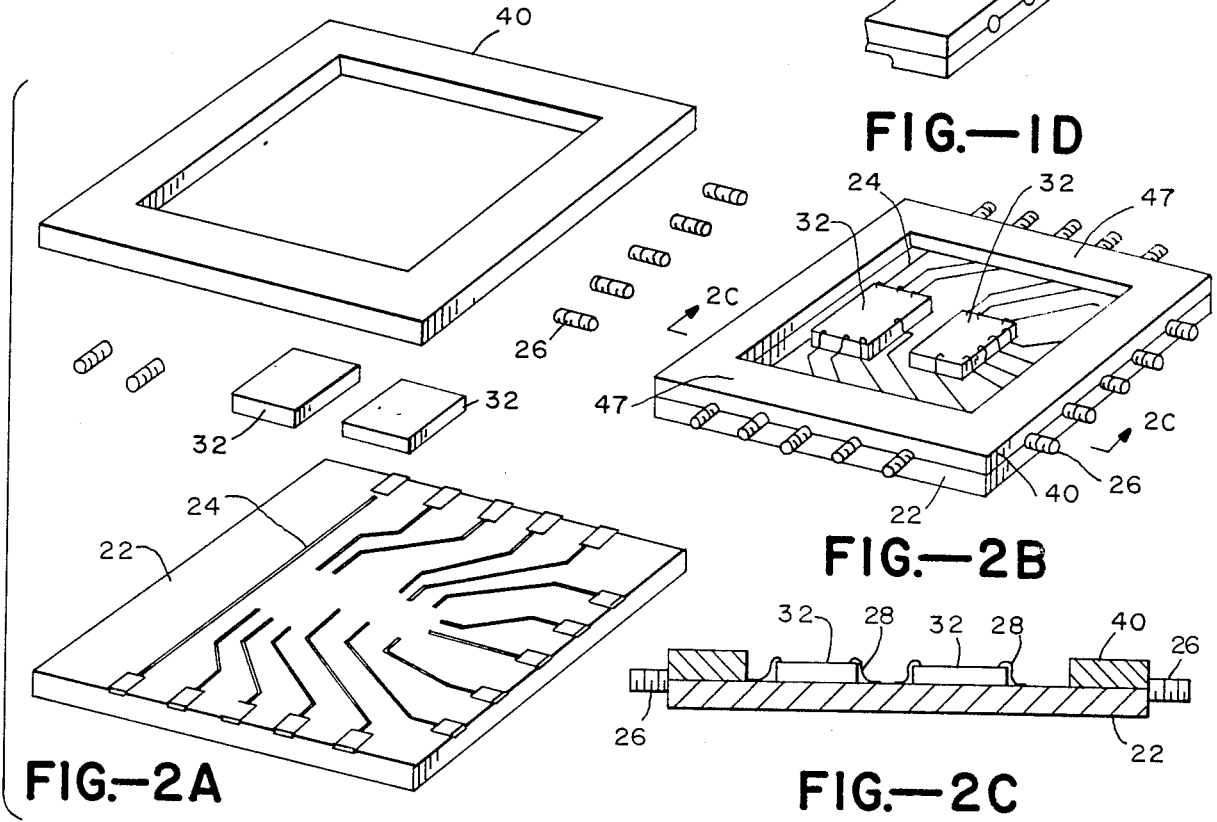
FIGS. 2a, 2b and 2c are views similar to FIGS. 1a, 1b and 1c but illustrating an alternative embodiment of the present invention.

In FIGS. 2a, 2b and 2c a completed layer of the alternate embodiment is shown to include substrate 22, traces 24, pins 26, bonds 28 or 30, vias 34 (where needed) and spacer 38 or 40. Preferred layer 46 results if spacer 38 or 40 is connected to the opposite side of substrate 22 as chips 32 as shown in FIG. 1. Alternate layer 47 results if spacer 38 or 40 surrounds chips 32 on substrate 22 as shown in FIG. 2.

FIG. 3 shows a plurality of layers 46 joined together to form stack 44. To further simplify this disclosure only layer 46 is described. Layer 47 may be substituted for layer 46. In other words stack 44 could also be formed of a plurality of layers 47. Stack 44 is characterized by extremely dense electronic circuitry. In order to simplify this disclosure only pins 26 and holes 54 are described for connecting each layer to external circuitry. It is obvious to one skilled in the art that depressions 36 and bump bonds 56 may be substituted for pins 36 and holes 54.

The layers 46 in this embodiment and those alternate embodiments described below are joined together using conventional integrated circuit packaging techniques. The layers 46 may be joined using indium solder, solder preform, epoxy glass or other adhesives known in the art. In this manner the stack made of the layers 46 forms an integral sealed module. The coupling between layers 46 may be used to form an hermetic seal protecting the chips 32.

Electrical connection is made to each layer 46 of stack 44 through pins 26. Electrical interconnection between layers 46 of stack 44 is conducted through a Side Interconnect Plate (SIP) 50. SIP 50 is a substrate, usually ceramic, of the same dimensions as the surface of stack 44 to which it attaches. Traces 52 are disposed on the surface of SIP 50. SIP 50 may have multiple layers of traces depending upon the application for which stack 44 is configured. At appropriate places on SIP 50 and coupled to traces 52 are holes 54 as necessary to couple to pins 26. Traces 52 and through-holes 54 may be configured by the designer as necessary for a particular application. One trace 52 may connect to multiple layers 46. One trace 52 may be connected to several pins 26 which performs an identical function for each of several chips 32. Thus, for specific applications, data buses, power supplies or ground signal for stack 44 may be formed by the appropriate placement of traces 52, traces 24 and pins 26.

In FIG. 3, the top layer 46 in stack 44 connects to end cap 48, usually ceramic. End cap 48 protects chips 32 in the top layer 46 of stack 44. All other chips 32 within stack 44 are protected by the layer 46 immediately above. If stack 44 is formed of layers 46, end cap 48 must also have a spacer 38 or 40. If stack 44 is formed of layers 47, end cap 48 need only be a rectangular parallelepiped of the same dimensions as substrate 22.

The preferred embodiment of the invention is shown in FIG. 4 and FIG. 5. As shown in FIG. 4, heat sink members 72 or 74 are positioned within the stack between layers 46 or 47. Either spacer 38 or 40 may be used with heat sinks 72 or 74. Where spacer 38 is wider than heat sink 72 or 74, the spacer 38 has notch 42 to accommodate the heat sink. The heat sink member 72 which is used between layers 46, where spacer 38 or 40 surrounds the back side of substrate 22 and thus protects chips 32 of the next layer has a "U" shaped bend in order to avoid interfering with chips 32. The heat sink member 74 which is used between layers 47, where spacer 38 or 40 surrounds chips 32 on substrate 22 is a straight member. Heat sink member 72 or 74 are relatively thin within the bounds of stack 44. In those situations where notch 42 is included in spacer 38 or 40 the heat sink may be of a similar dimension as notch 42 thereby adding no additional thickness to the stack. External to the boundaries of stack 44 heat sink member 72 or 74 may have their dimensions increased in order to improve heat dissipation. Where chips 32 have been flip chip bonded to substrate 22, a thermally conducting bond 76, commonly eutectic, may be formed between the back surface of chip 32 and heat sink 72 or 74 for more efficient heat dissipation. In those situations where wire bonds 30 are employed to connect chips 32 to substrate 22 a metal slug 31 may be embedded in the substrate 22 in the appropriate locations which are underneath the chips 32 which are wire bonded 30 to substrate 22 for more efficient heat dissipation. The metal slug 31 contacts the back surface of chips 32 and the heat sink 72 or 74. Heat is conducted away from the chips 32 via slug 31 and into heat sink 72 or 74.

Heat sink members 72 or 74 are typically made of metal or other heat conductive material which typically also conducts electrical signals. In order to avoid the possibility of electrical shorts where wire bonds are used, the surface of the heat sink 72 or 74 which faces the wire bonds is electrically insulated, commonly porcelainized; i.e. one surface of the heat sink is coated with porcelain or other nonconductive material.

To simplify the disclosure, only layer 46 and heat sink 72 will be discussed. Layer 47 and heat sink 74 may be substituted for layer 46 and heat sink 72. As shown in FIG. 5 two or more layers 46 and heat sinks 72 are joined together to form stack 78. Heat sinks 72 need only be interspersed between layers 46 as is necessary to keep the temperature of stack 78 within the specific bounds. For those layers 46 without heat sink 72 spacer 40 not 38 must be used. End cap 48 protects the chip at an the end of stack 78 which has no layer 46 covering it. SIPs 50 form interconnections between layers 46 of stack 78 in the preferred embodiment.

Stack 78 connects to base plate array 80 for external electrical connection. An array of pins 82 penetrate ceramic substrate 86. Traces 84 are disposed on substrate 86 and are electrically coupled to appropriate pins 82 as required by the application. Certain of traces 84 extend to the edge of base array 80. Pins 90 are connected to the side of base array 80 for interconnection to SIP 50. Ceramic cover plate 88 connects to substrate 86 and covers traces 84. SIPs 50 connect to base array 80 simply as if it were another layer 46.

FIG. 6 shows another method for connecting stack 44 or stack 78 to a PGA base plate. Base plate 81 comprises a substrate 87 from which extend pins 83 and through which penetrate holes 91. Formed on substrate 87 and electrically coupled to pins 83 and holes 91 are traces 85. A secondary substrate or spacer 89 may be attached to substrate to cover, insulate and protect traces 85. Connector pins 26 of stack 44 or stack 78 penetrate and are electrically coupled to holes 91. The connection between pins 26 and these holes 91 may be inspected visually or otherwise for high reliability and quality applications.

FIG. 7 shows a first alternate embodiment of the invention used for those applications which do not require the heat removal efficiency of the preferred embodiment. The subassembly of FIG. 7 including stack 44, end cap 48, SIP 50 and external side interconnect plate ESIP 58 is mounted within package base 62. ESIP 58 is similar to SIP 50 in that it is a ceramic substrate, with traces 52 and holes 54 placed to couple to pins 26. However, ESIP 58 has dimensions sufficiently larger than the surface of stack 44 to which it attaches to allow for bond pads 60. Thus, after connection and coupling of stack 44 to ESIP 58, external signals may be coupled to stack 44 through standard wire bonding techniques to bond pads 60. The ESIP 58 is mounted into package base 62. Penetrating through the walls of the cavity of base 62 are package pins 64. After insertion of the subassembly into package 62, wire bonds 70 connect pins 64 to bond pads 60. Package cap 66 covers and protects stack 44, SIP 50, ESIP 58 and wire bonds 60. Where needed for heat dissipation heat sink 68 is attached to the outside of base 62.

FIG. 8 shows a modification of the preferred embodiment described above in relation to FIG. 5. In this embodiment the major components are similar to those shown in the drawing of FIG. 5 and similar components are numbered similarly.

The circuit layer 45 of the application shown in FIG. 8 includes a heat sink 74, four integrated circuit chips 32, a plurality of pins 26, and a frame 160 having internal traces 24. The frame 160 is mounted onto the heatsink in the location shown by the dotted lines 156. The chips 32 are mounted onto the heat sink 74 in predetermined locations 154 as shown. In this manner the chips 32 are surrounded by the frame 160 on the heatsink 74.

The frame 160 is formed from overframe 150, protector frame 152 and traces 24 using conventional techniques. The traces 24 for carrying electronic signals to and from the chips 32 are previously formed on the surface of the protector frame 152. The overframe 150 is mounted on top of the protector frame 152. The protector frame 152 and the overframe are formed with holes therethrough corresponding to the chips 32 as shown. The holes in the overframe 152 are generally larger than the holes in the protector frame 150. In this way the traces 24 and the upper surface of the protector frame 152 are exposed within the holes in the overframe 150. The traces 24 are thereby available for wire bonding. Generally, the protector frame 152, the overframe 150 and their respective traces 24 are preformed in the green state of ceramic. The frames are then co-fired to form the frame 160 into a single unit having internal traces prior to assembly within the stack 78. The frame 160 may be formed from several frame layers such as 150 and 152 to form a multilayer interconnection system of traces 24.

The overframe 150 is formed of a smaller outer dimension than the protector frame 152. The notch 158 is formed by placing the two frames 150 and 152 together. The notch 158 is used to mechanically support the pins 26 thereby improving the mechanical strength of the coupling of the pin 26 to the layer 45.

If the heatsink 74 is electrically conductive then the electrical potential of the substrate of the chip 32 using conventional chip mounting techniques may be controlled by the heatsink 74. In such an application it is preferred to electrically couple each heatsink 74 in the stack 78 to one another and to a predetermined electrical potential. Alternatively, the heatsink may be formed of or coated with an electrically inert material. In such an application the electrical potential of the substrate may be controlled by conventional techniques such as an on-chip back-bias generator. If the heatsink is formed of Berylium Oxide then it will be both electrically inert and thermally active.

FIG. 9 shows a second alternate embodiment necessary for those applications which require more dissipation of heat than can occur in the preferred embodiment. Layer 46 is identical to that disclosed in the preferred and first alternate embodiment. Selectively interspersed between layers 46 are fluid cooling layers 92. Cooling layer 92 is composed of substrate 94 and cap 102 which are the same dimensions as layer 46. Inlet channel 96 and outlet channel 98 are etched into substrate 94. Inlet 96 and outlet 98 extend from the edge of opposite sides and run parallel to the other pair of opposite edges of substrate 94. Inlet 96 and outlet 98 do not extend completely across substrate 94, but terminate within the boundaries of substrate 94. Etched between inlet 96 and outlet 98 are a plurality of parallel microchannels 100. The microchannels, with a typical dimension of 800 microns, are of a sufficiently small size to reduce turbulent flow in liquids flowing through the microchannel 100. Cap 102 connects to substrate 94 in order to seal inlet channel 96, outlet channel 98 and microchannels 100.

Forcing a liquid into inlet 96 fills that channel before being forced through microchannels 100. Liquid flowing through channels 100 will absorb heat and remove it from the electronic circuitry on layers 46. Cooling layers 92 need only be interspersed between such layers 46 as is necessary for cooling the specific application.

SIPs 104 are formed also to function as a fluid conduits to cooling layers 92. SIP 104 comprises a substrate 110 on which are formed traces 114 which are coupled to holes 116. Holes 116 are coupled to receive signals from pins 26 of layer 46. These elements perform the same functions as on SIP 50. Supply channel 106 is incorporated into substrate 110 along one edge from one extreme edge of substrate 110, but positioned so as to avoid interference with traces 114. In certain materials such channels may be formed by etching. Cover 112 is joined to substrate 110 to seal channel 106. Holes 120 are formed through cover 112 to allow electrical coupling to traces 114 by pins 26 and to allow fluid in channels 106 to reach inlets 96 or outlets 98. Nipples 108 are connected to certain holes 120 and cover 112 to mechanically couple SIP 104 to stack 118 for fluid flow. A second SIP 104 is connected to another side of stack so that outlets 98 are connected to nipples 108 for removal of cooling fluid. In certain circumstance, these cooling channels may be integral with substrate 46 in FIG. 1a.

An example for forming a ¼ MByte static RAM module is disclosed. The chips selected for this example are 64K by 1 SRAMs; e.g. the Integrated Device Technology IDT #7187. In order to achieve ¼ MByte of memory, thirty-two chips are required. One design can be built having eight layers with four devices per layer. Each substrate is 25 mils thick. Each spacer is 35 mils thick. Each heat sink is designed to be of proper dimensions to fit within the notch formed in each spacer. A pin grid array base is 40 mils thick. The end cap may be formed to be 20 mils thick. The stack is thus 540 mils tall for substrate material, spacers, end cap and base plate plus 10×0.6 mils associated with interlayer adhesive. The entire stack is thus only 600 mils tall.

Each die is 138 mils by 369 mils. The spacing between each die is 100 mils. The spacing between the die and the edge of the layer is 50 mils. The die are arranged as shown in FIG. 12. Thus, the minimal layer size is 1250 mils by 1000 mils. The base plate will be the same size as any of the layers. This is the footprint required for the completed assembly for attachment to an external circuit. However, because of the heat sink overhang, each layer further requires 180 mils on each of the two opposite edges of the stack creating an overall footprint for a ¼ MByte memory of 1.6 inches by 1.1 inches, i.e. a total of 1.8 square inches. Conventional packaging of the same number of chip would require 18 square inches.

FIGS. 10 and 11 show the trace pattern for each of the SIPs necessary for appropriate interconnection between each of the layers and to the pin grid array base plate. FIG. 12 shows the trace pattern necessary for a single layer to connect each of the four die to each other and to each SIP on a given layer. The completed package conforms to industry standards with respect to pin spacings and dimensions.

A unique three-dimensional, high density package and packaging technology for integrated circuits is disclosed which is easily and inexpensively manufactured. Industry standard packaging techniques may by used in manufacturing such a module. Commercially available integrated circuits may be packaged in such a module without any modifications to the chips.

What is claimed is:

1. A three-dimensional, high density integrated circuit package comprising
a. at least two integrated circuit layers, each of said layers having a first face and a second face and a plurality of edges, wherein at least a portion of the respective faces of said layers are juxtaposed in a face-to-face contacting relationship forming an integral, hermetically sealed stack of said layers, and further wherein each of said layers is an integral unit including:
   (1) a subtract member having a plurality of edges, wherein at least one of said edges includes a plurality of operative connectors,
   (2) at least one integrated circuit chip member mounted on each said substrate, said chip being operatively coupled to said connectors, and
   (3) a spacer member having a central aperture surrounding each said chip on each said substrate,
b. side interconnection plate means including conductive means for operatively interconnecting any one or more of said connectors on any one of said layers with any one or more of said connectors on any other said layer, whereby at least one of said connectors communicates with one or more external circuits, and further comprising heatsink members interspersed at predetermined intervals between said layers to provide lateral heat dissipation for each of said layers.

2. The three-dimensional, high density integrated circuit package according to claim 1, wherein each said substrate member is made of a material selected from the group consisting of ceramic (Aluminum Oxide), polyimide, epoxy-glass, Beryllium Oxide, Aluminum Nitride or Silicon.

3. The three-dimensional, high density integrated circuit package according to claim 1 which further comprises a protective lid connected to said stack over the top chip in said stack.

4. The three-dimensional, high density integrated circuit package of claim 1 wherein said means for interconnecting further comprises:
a. an interconnection substrate having appropriately placed interconnection connectors which operatively couple to said connectors; and
b. conductive regions for operative interconnection of said interconnection connectors.

5. The three-dimensional, high density integrated circuit package according to claim 4 further comprising fluid cooling members interspersed at predetermined intervals between said layers.

6. The three-dimensional, high density integrated circuit package according to claim 5 further comprising means for supplying fluid to and removing fluid from said cooling members.

7. The three-dimensional, high density integrated circuit package according to claim 6 wherein said fluid cooling members further comprise
a. a substrate member having an inlet channel and an outlet channel and a plurality of microchannels connected between said inlet channel and said outlet channel, and
b. a cover member.

8. The three-dimensional, high density integrated circuit package according to claim 7 wherein a fluid supplying and removing means comprises a supply member and removal member each comprising
a. a fluid source substrate having a source channel,
b. source holes coupled to said inlet channel or said outlet channel of fluid cooling members, and
c. nipples coupled to said inlet channel or said outlet channel.

9. A three-dimensional, high-density integrated circuit package comprising
a. at least two integrated circuit layers, each of said layers having a first face and a second face and a plurality of edges, wherein at least a portion of the respective faces of said layers are juxtaposed in a face-to-face contacting relationship forming an integral, hermetically sealed stack of said layers, and further wherein each of said layers is ann integral unit including:

(1) a substrate member having a plurality of edges, wherein at least one of said edges includes a plurality of operative connectors, (2) at least one integrated circuit chip member mounted on each said substrate, said chip being operatively coupled to said connectors, and (3) a spacer member having a central aperture surrounding each said chip on each said substrate, b. side interconnection plate means including conductive means for operatively interconnecting any one or more of said connectors on any one of said layers with any one or more of said connectors on any other said layer, whereby at least one of said connectors communicates with one or more external circuit and wherein said means for operatively interconnecting further comprises an interconnection substrate having appropriately placed interconnection connectors which operatively couple to said connectors, conductive regions for operative interconnection of said interconnection connectors, said package further comprising a package base member having
 a. a cavity which receives said stack,
 b. means for mounting said stack in said cavity, and
 c. a plurality of pins coupled to said connectors for operative connection to circuitry external to said package base.

10. The three-dimensional, high density integrated circuit package according to claim 9 further comprising a cap for enclosing said stack within said cavity.

11. The three-dimensional, high density integrated circuit package according to claim 4 which further comprises a base plate member which includes an array of operative contacts which are operatively coupled to said connectors.

12. The three-dimensional, high density integrated circuit package according to claim 11 further comprising a heatsink member attached to said package base member.

13. The three-dimensional, high density integrated circuit package according to claim 11 which further comprises means for connecting to said layers, said package, said connectors and said contacts for purposes of testing.

14. A three-dimensional, high density integrated circuit package, comprising a. at least two integrated circuit layers, each of said layers having a first face and a second face and a plurality of edges, wherein at least a portion of the respective faces of said layers are juxtaposed in a face-to-face relationship forming an integral hermetically sealed stack of said layers, and further wherein each of said layers is an integral unit including (1) an integral heat sink member, (2) at least one integrated circuit chip member mounted on said heat sink so that each heat sink provides lateral heat dissipation for each chip member, (3) a spacer member having a plurality of edges, an aperture surrounding said chip on said heat sink and having an hermetic seal with adjacent ones of the layers and heat sink, and a plurality of electrical connectors on at least one of said edges coupled to said chip, b. side interconnection plate means including conductive means for operatively interconnecting any one or more of said connectors on any one of said layers with any one or more of said connectors on any other said layer, whereby at least one of said connectors communicates with one or more external circuits.

15. The three-dimensional, high density integrated circuit package according to claim 14, wherein each said substrate is made of a material selected from the group consisting of ceramic (Aluminum Oxide), polyimide, epoxy-glass, Beryllium Oxide, Aluminum Nitride or Silicon.

16. The three-dimensional, high density integrated circuit package according to claim 14 which further comprises a protective lid connected to said stack over the top chip in said stack.

17. The three-dimensional, high density integrated circuit package of claim 14 wherein said means for operatively interconnecting further comprises a. an interconnection substrate having appropriately placed interconnection connectors which operatively couple to said connectors, and b. conductive regions for operative interconnection of said interconnection connectors.

* * * * *